US009664724B2

(12) United States Patent
Oestreicher

(10) Patent No.: US 9,664,724 B2
(45) Date of Patent: *May 30, 2017

(54) DEVICE AND METHOD FOR MONITORING AND SWITCHING A LOAD CIRCUIT

(71) Applicant: Pepperl + Fuchs GmbH, Mannheim (DE)

(72) Inventor: Michael Oestreicher, Mannheim (DE)

(73) Assignee: Pepperl + Fuchs GmbH, Mannheim (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/807,425

(22) Filed: Jul. 23, 2015

(65) Prior Publication Data

US 2016/0025793 A1 Jan. 28, 2016

(30) Foreign Application Priority Data

Jul. 28, 2014 (EP) ..................................... 14178796

(51) Int. Cl.
*G01R 31/04* (2006.01)
*G01R 31/02* (2006.01)
(Continued)

(52) U.S. Cl.
CPC ............. *G01R 31/025* (2013.01); *G05B 9/02* (2013.01); *G05B 15/00* (2013.01); *G05B 23/00* (2013.01)

(58) Field of Classification Search
CPC .... H01H 83/04; H01H 2083/203; H01H 9/22; G01R 31/327; G01R 23/02; G01L 9/00; H01L 2224/48091
(Continued)

(56) References Cited

U.S. PATENT DOCUMENTS 7,046,031 B2 * 5/2006 Magerl .................... G05B 9/03
307/113
2005/0035665 A1 2/2005 Magerl et al.
2013/0057293 A1 * 3/2013 Miyamoto ........... G01R 31/362
324/433

FOREIGN PATENT DOCUMENTS

DE 10327959 A1 1/2005
GB 2294336 A 4/1996

OTHER PUBLICATIONS

Kelperis, K., Application No. EP 14 17 8796, "European Search Report," Feb. 18, 2015, 2 pages.

* cited by examiner

*Primary Examiner* — Melissa Koval
*Assistant Examiner* — Trung Nguyen
(74) *Attorney, Agent, or Firm* — LaBatt, LLC

(57) ABSTRACT

In a device for monitoring and switching a load circuit, having an input part and an output part, having switching inputs to connect a controller to the input part, having switching outputs to connect at least one load circuit with at least one load to be switched to the output part, having at least one load switch to switch, in particular to switch on and off, the at least one load, having a first fault detection circuit, connected in parallel with the load circuit, to detect faults in the load circuit, and having a second fault detection circuit, connected in series with the load circuit, to detect faults in the load circuit, the input part has an input circuit which converts switching commands of the controller incoming via the switching inputs into switching processes of the load switches. The first and the second fault detection circuit respectively generate intermediate fault signals which are logically linked in a logic circuit to form an overall fault signal. The overall fault signal is transmitted from the output (Continued)

part to the input part and made available via the switching inputs for evaluation.

17 Claims, 3 Drawing Sheets

(51) Int. Cl.
    *G05B 15/00*     (2006.01)
    *G05B 23/00*     (2006.01)
    *G05B 9/02*     (2006.01)

(58) Field of Classification Search
    USPC ....... 324/425–440, 444, 255, 500, 522, 713,
            324/72.5, 76.11, 134, 111, 538–543, 600,
            324/756.01
    See application file for complete search history.

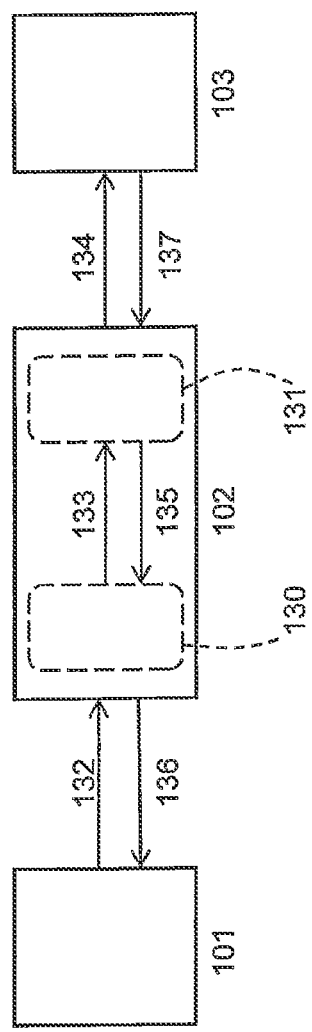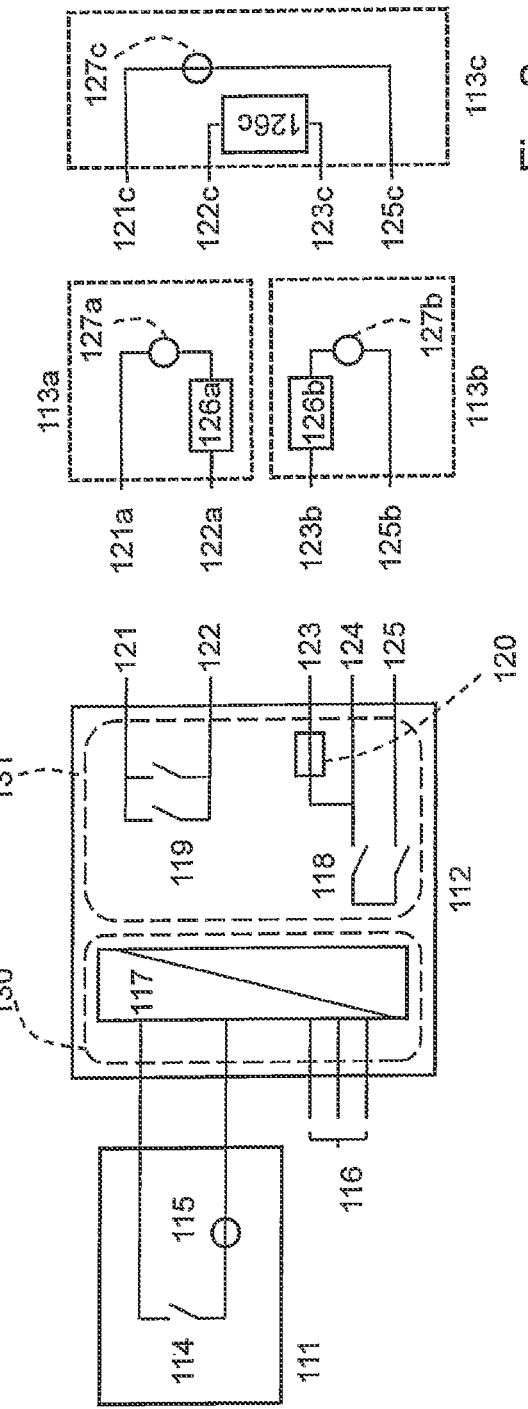

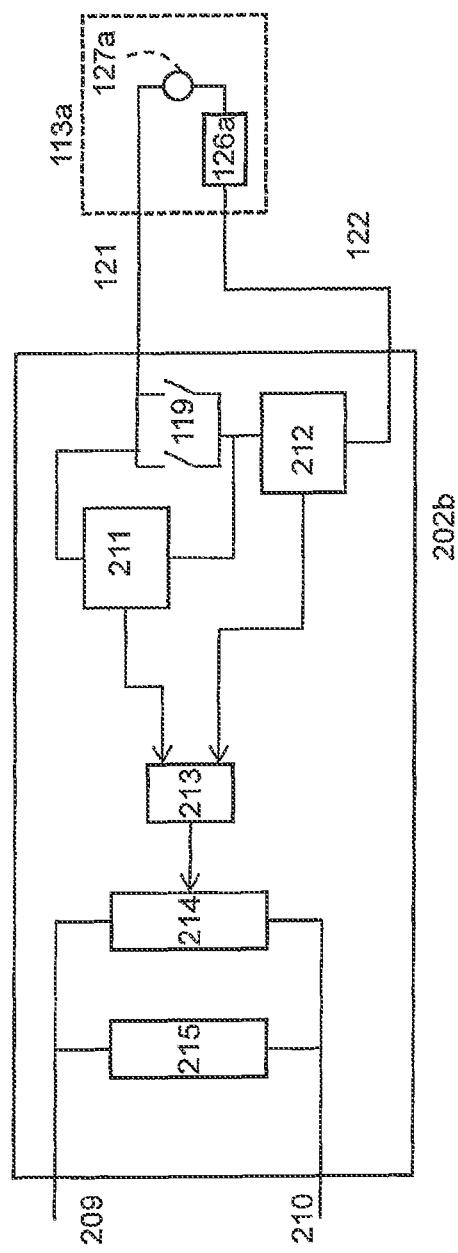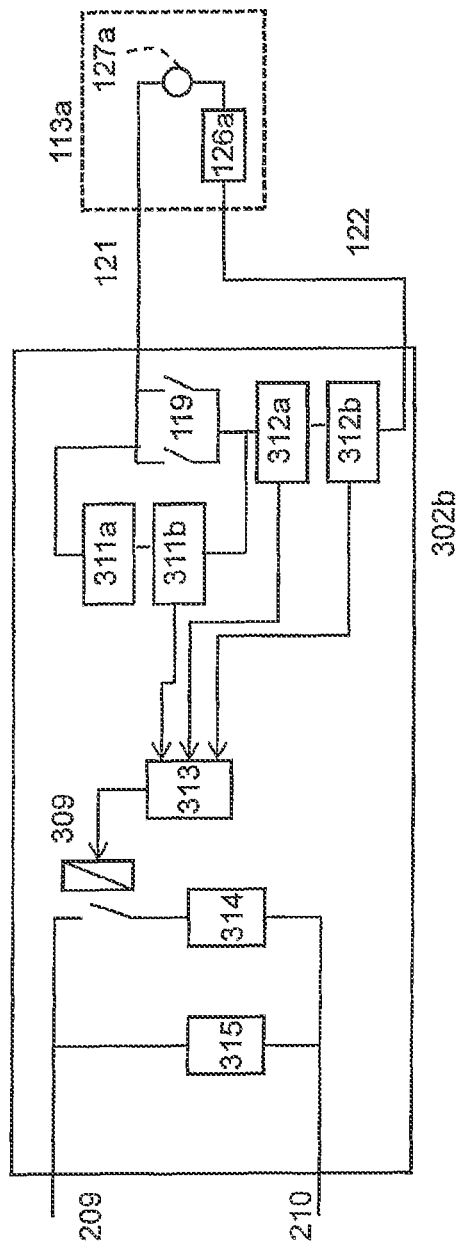

DEVICE AND METHOD FOR MONITORING AND SWITCHING A LOAD CIRCUIT

REFERENCE TO RELATED APPLICATIONS

The current application claims priority to European Patent Application No. 14 178 796.0, which was filed on 28 Jul. 2014, and which is hereby incorporated by reference.

TECHNICAL FIELD

The present invention relates to a device and a method for monitoring and switching a load circuit, thus a current circuit comprising a load circuit supply and a load, wherein this current circuit can be switched, in particular closed or interrupted, by a load switch.

BACKGROUND ART

In the field of process automation sensors and/or actuators (or effectors, etc.), thus converters (or drive elements, controlling elements), which convert commands of a controller (e.g. of a control computer), mostly present in the form of electrical signals, into forces, movements or other physical effects (such as e.g. a pressure or temperature change), are frequently controlled via point-to-point connections by controllers. An interface component (interface) is frequently arranged between the actual controller and the sensor or actuator, which adapts the electrical properties of the signals emitted by the controller to the properties required for the signals to be received by the sensors or actuators due to the mode of construction and functioning of these sensors or actuators. The controller is located in these cases on the control side of the interface, whereas the side of the interface facing away from the controller is called the field side.

The term "line fault transparency" is understood to be a function of such systems which ensures that a fault, for example a line break or a short circuit, in the wiring on the field side of an interface is transmitted to the control side thereof, so that the controller can detect the fault, and wherein the fault ideally manifests itself on the control side in the same way for the controller as if this fault arising on the field side were present on the control side of the interface. A series of conventional controllers indeed offers the possibility of detecting faults such as line breaks or short circuits in the wiring by field devices connected directly to the controller.

If an interface is switched between the controller and a field device the controller can only detect faults in the cable connection on the control side of the interface but not faults on the field side of the interface. This is particularly problematic in cases in which the interface is arranged in proximity to the controller because the relatively long cable section between the interface and the field device remains unmonitored.

SUMMARY OF THE INVENTION

An object of the present invention can thus be seen in indicating a technical teaching, with which the outlined situation can be improved as far as possible.

This object is achieved by the device having the features of claim 1 and by the method having the features of claim 14.

Preferred embodiments of the present invention will be described below, in particular with reference to the dependent claims and the figures.

According to the invention a device for monitoring and switching a load circuit is provided, having an input part and an output part, having switching inputs to connect a controller to the input part, having switching outputs to connect at least one load circuit with at least one load to be switched to the output part, having at least one load switch to switch, in particular to switch on and off, the at least one load, having a first fault detection circuit, connected in parallel with the load circuit, to detect faults in the load circuit, and having a second fault detection circuit, connected in series with the load circuit, to detect faults in the load circuit.

There, the input part has an input circuit which converts switching commands of the controller incoming via the switching inputs into switching processes of the load switches. The first and the second fault detection circuit each generate intermediate fault signals which are logically linked in a logic circuit to produce an overall fault signal. The overall fault signal is transmitted from the output part to the input part and made available via the switching inputs for evaluation.

The device according to the invention for monitoring and switching a load circuit or one of the preferred embodiments thereof is preferably switched as an interface between a controller and a unit to be controlled on the field side, thus in particular a sensor or an actuator, or is a constituent part of such an interface. In this sense reference is also made below to an interface according to the invention.

In the present context a load circuit is to be understood to be a current circuit comprising a (not necessarily ohmic) load and a load circuit supply, thus an electrical energy source, which allows a current, in particular a direct current or an alternating current, to flow in the load circuit through the load. The load circuit is a current circuit in a unit to be controlled on the field side of the device, thus in particular in a sensor or in an actuator.

In the present context a load is to be understood to be any general, in particular also non-ohmic, electrical consumer.

In the present context a load switch is to be understood to be a means for switching a load or a current in a load circuit, in particular for switching on and off a load or a current in a load circuit.

In the present context a device for monitoring a load circuit is to be understood to be an electronic or electrical circuit which ensures that a fault, in particular a line break or a short circuit, in the load circuit to be monitored on the field side of the device manifests itself preferably as the same type of fault, thus in particular as a line break or a short circuit, on the control side of the device for the controller.

In the present context an input part of a device according to the invention, in particular an interface according to the invention, is to be understood to be a sub-device, in particular a sub-circuit, to which a controller is or can be connected via switching inputs. The input part receives switching commands of the controller via the switching inputs, receives a fault signal from an output part of the device according to the invention and makes the received fault signal available to the controller via the switching inputs for evaluation. This preferably takes place in the form of a switchable no-load current in the input part which is switched in dependence upon the received fault signal. The aim of the line fault transparency, in particular the provision of a defined no-load current at the input part of the device according to the invention, can be realised particularly simply and effectively with such a circuit.

In the present context an output part of a device according to the invention, in particular an interface according to the invention, is to be understood to be a sub-device, in particular a sub-circuit, to which at least one load circuit of at least one unit to be controlled, with at least one load, is connected, or can be connected, via switching outputs. The output part has at least one load switch to switch the at least one load which is preferably in active connection with an input circuit of the input part, wherein the input circuit converts switching commands of the controller incoming via the switching inputs into switching processes of the load switches.

In the present context a switching input is to be understood to be at least one electrically conductive terminal contact of the input part of a device according to the invention, in particular an interface according to the invention, via which the input part and thus the device is or can be connected to a controller.

In the present context a switching output is to be understood to be at least one electrically conductive terminal contact of the output part of a device according to the invention, in particular an interface according to the invention, via which the output part and thus the device is or can be connected to a load circuit.

In the present context an input circuit is to be understood to be a sub-circuit of the input part of a device according to the invention, in particular an interface according to the invention, which converts switching commands of the controller incoming via the switching inputs into switching processes of the load switches. Such an input circuit preferably has at least one relay to switch at least one load switch.

In the present context a switching command of a controller is to be understood to be an electrical signal, a plurality of simultaneous electrical signals and/or a temporal sequence of electrical signals which are received by an input circuit via switching inputs of the controller and preferably converted with the aid of the output circuit into switching processes of the load switches.

In the present context a fault signal is to be understood to be an electrical, in particular electromagnetic, mechanical, optical or optoelectronic, signal or a combination of such signals or a temporal sequence of such signals, which is intended to indicate a fault in the load circuit. An intermediate fault signal is to be understood to be such a fault signal in the output part of a device according to the invention, in particular an interface according to the invention. A transmitted fault signal or an overall fault signal is to be understood to be such a fault signal in the input part of a device according to the invention, in particular an interface according to the invention.

In the present context a fault detection circuit is to be understood to be an electrical or electronic circuit which is electrically connected, preferably in series or in parallel, with at least one load circuit and generates a fault signal if a fault arises or is present in this at least one load circuit.

In the present context an evaluation of a fault signal is to be understood to be a processing of this fault signal, preferably by a, or the, controller, of which the result in the controller influences the operating mode of the controller having regard to the switching of at least one load in at least one load circuit switched by the controller.

In the present context a no-load current or a no-load current path are to be understood to be a switchable electrical current flowing on the control side of the device according to the invention or a circuit arrangement for generating a switchable no-load current. The flowing of the no-load current indicates to the controller preferably that no line break is present in the load circuit.

In the present context a fault in the load circuit is to be understood in particular to be a line break or a short circuit in the load circuit.

If the line is disconnected at a point in a current circuit, for example due to a defective cable or a loose plug-in connection, a line break is present. This prevents a current flow in all operating states and is thus in principle very easy to detect. In the case of a switched-on load, the testing of the current flow is thus sufficient to detect a line break. If the load is switched off, the invention provides, for example, to take from the load circuit a preferably low test current, which is in particular constant and particularly preferably is selected so low that this current cannot switch on the load. If this test current flow is or has been interrupted a line break can be concluded.

A short circuit can, depending upon the location at which it arises, have different consequences. It is a question of whether the voltage supply of the load is realised by the interface according to the invention or by an external voltage supply. In the former case, thus if the voltage supply of the load is realised by the interface according to the invention, there are typically only two live wires between the interface and the load. If a short circuit arises here at any point, this can be detected through a reduction in the resistance, going hand in hand with the short circuit, in the current circuit in question.

In the switched-on state of the load the current will increase as a result of the short circuit to considerably higher values than those that arise in the normal, fault-free operation. This situation can be detected by a circuit which can detect such unusually high currents (over-currents). In the switched-off state of the load the detection of a short circuit is possible by reference to the voltage generated by the no-load current in the load circuit. The line resistances must thereby be observed, which can also ensure in case of a short circuit that a voltage arises in the load circuit. If the output terminals of the interface according to the invention are galvanically isolated from the field side, a ground fault can possibly be detected only upon occurrence of a second fault.

If the interface according to the invention contains only switching elements which switch on or switch off an external voltage supply, a short circuit can then arise at different points.

A short circuit at the voltage source interrupts the load supply and thus prevents a current flow through the load. This affects most diagnostic circuits like a line break, although the wiring is not disconnected at any point.

If a short circuit arises over the load this is very difficult to ascertain in the switched-off state, as the change in the load resistance caused by the short circuit is also difficult to measure with a no-load current, because the total voltage lies at the open contacts of the interface according to the invention. If the load circuit is switched on with a load short circuit present, the fuse of the voltage supply of the load circuit trips (in many cases, in particular with suitable dimensioning of the fuse), whereby a line break results. If this is not the case, the short circuit can be detected via a current that is too high through the output terminals of the interface according to the invention.

In the case of a short circuit at the contacts of the interface according to the invention the load is unintentionally switched on. For the interface itself, however, the voltage in the load circuit decreases to 0 volts, which many conventional diagnostic circuits indicate as a line break in the load circuit.

If an external voltage supply of the load has a ground reference, a ground fault, in particular with open collector outputs, can lead to unintentional switching-on of the load. This arises in particular if the fault arises on the wire which connects the load to the output of the interface according to the invention.

According to a preferred embodiment of the present invention the overall fault signal is transmitted to a switching stage in the input part of the device, wherein this switching stage assumes one of at least two possible states in dependence upon whether a fault or which fault type has been detected in the load circuit.

In this way the overall fault signal is represented in the input part in the form of a stable signal which can be detected by the controller.

In the present context a switching stage is to be understood to be an electronic or electrical circuit which switches, in particular switches on or off, a current, in particular in a no-load current path, in dependence upon a control signal. Examples for switching stages in this sense are relays or semiconductor circuits controlled via one or a plurality of transistors. In the present context a switched switching stage is to be understood to be a switching stage in the switched state. Correspondingly a non-switched switching stage is to be understood to be a switching stage in the non-switched state.

According to a further preferred embodiment of the present invention the switching stage switches a no-load current in a no-load current path in the input part. In this way the controller "sees" at the input part of the device according to the invention a status corresponding to the status that the controller "would see" if the controller were directly connected to the load circuit. In this sense a high degree of line fault transparency is thus present here.

According to a further preferred embodiment of the present invention the no-load current has essentially the same strength as the test current. The principle of line fault transparency is realised to an even greater extent by this embodiment.

According to a further preferred embodiment of the present invention the logic circuit brings about an OR-operation of the intermediate fault signals. In this way the overall fault signal indicates a fault as soon as one of the intermediate fault signals indicates a fault.

According to a further preferred embodiment of the present invention the first fault detection circuit has a current regulator to take a test current from the load circuit, wherein the first intermediate fault signal generated by the first fault detection circuit is different in dependence upon whether the test current flows or is interrupted. This embodiment facilitates a particularly simple fault detection and a transparent transmission of fault statuses from the output part to the input part.

According to a further preferred embodiment of the present invention the test current is negligibly small with respect to a current flowing in the load circuit in the case of a load. This embodiment facilitates a fault detection with very low interference-causing effects on operations in the load circuit.

According to a further preferred embodiment of the present invention the test current is constant. This embodiment facilitates a fault detection that is particularly robust with respect to fluctuations in the currents in the load circuit.

According to a further preferred embodiment of the present invention the first fault detection circuit has a rectifier to rectify the test current. This rectifier causes an alternating current flowing in the load circuit to be rectified in the test current circuit connected in parallel with the load circuit. In this way the fault detection circuit can work irrespectively of whether a direct current or an alternating current flows in the load circuit.

According to a further preferred embodiment of the present invention the first fault detection circuit has a circuit for detecting a line break fault in the load circuit. The first fault detection circuit is connected in parallel with the load circuit and in parallel with the contacts of the load circuit. If the load circuit switches are open, the voltage from the load circuit supply lies at these switches. This voltage can be loaded with a preferably low current, the test current. Provided that the load circuit wiring is fault-free, a signal can be generated with this test current. The first fault detection circuit generates this logic signal from the test current. As an intermediate fault signal of the first fault detection circuit it is preferably transmitted via a galvanic isolation, particularly preferably via a relay, to the input part and made available to the switching inputs for evaluation by the controller. The galvanic isolation, preferably a relay or an optocoupler or similar, is preferably operated with an operating voltage which is fed to the device according to the invention, preferably to the interface according to the invention, via a separate energy supply. Alternatively, the galvanic isolation could also be operated with energy taken from the load circuit or the controller. The separate energy supply of the device according to the invention, preferably of the interface according to the invention, offers the advantage, however, that no assumptions need to be made concerning the current carrying capacity of the load circuit or controller.

If the test current drops out, a fault in the load circuit can be concluded. The first fault detection circuit generates an intermediate fault signal, of which the logic value indicates the drop-out of the test current. The relay in the input part opens and interrupts in the case of this fault the no-load circuit in the input part and thus indicates the line break in the load circuit in the form of a line break in the control circuit.

According to a further preferred embodiment of the present invention the second fault detection circuit has a circuit to detect a line break fault in the load circuit. This circuit for detecting a line break fault in the load circuit of the second fault detection circuit, connected in series with the load circuit, has the advantage that even if the load circuit switches of the load circuit are closed, if no voltage is available at the load circuit switches, with which a test current could be generated, a line break fault in the load circuit can be detected.

According to a further preferred embodiment of the present invention the second fault detection circuit comprises a circuit for detecting a short circuit fault in the load circuit.

A separate, independent energy supply of the device according to the invention offers the possibility of operating circuits for fault detection in series with the load circuit switches. In this way, even in the case of closed (thus electrically conductive) load circuit switches, the detection of an over-current (lying above the maximum threshold) or a drop-out current (lying below a minimum threshold) in the load circuit is possible, whereby the detection of a short circuit (in particular on the load) or a line break is possible. A short circuit is thereby expressed by an over-current and a line break by a current drop-out in the load circuit.

The independent energy supply of the device according to the invention is preferably realised with the aid of a so-called power rail. This is an insert part for a 35 mm standard rail which preferably has three or five power rails. Two of these rails supply units with corresponding contacts with a voltage of preferably 24V DC. The rail can be used for an overall fault message. As soon as a fault occurs on a unit compatible with the power rail, this unit transmits the fault to the rail. The fault can be picked up there for all units located on the rail and transmitted to the relevant controller.

With one input, therefore, all units located on the rail can be monitored for faults. Unused rails can be used by correspondingly equipped units for a bus communication.

The device according to the invention is preferably galvanically isolated from the power rail, particularly preferably by a switched-mode power supply (SMPS). This offers the advantage that the fault detection circuits, if required, can also be operated with a voltage other than 24V. Through the independent energy supply of the device according to the invention, energy is available for operating the fault detection circuits even if the load circuit is switched on, whereby a greater number of different faults can be detected than with the aid of fault detection circuits which can only be operated if load circuit switches are open, i.e. not electrically conductive.

The second fault detection circuit, connected in series with the load circuit, preferably has suitable sub-circuits to detect current drop-outs and/or over-currents in the load circuit even if load circuit switches are closed. With such first and second fault detection circuits, line breaks can thus be detected when load circuit switches are open and line breaks and/or short circuits when load circuit switches are closed. These three types of fault can be differentiated in the input part of the device according to the invention by the controller if the different intermediate fault signals are linked to form an overall fault signal, which makes a differentiation possible. In the case of a simple OR-operation of the intermediate fault signals, however, this is not directly possible.

The first fault detection circuit, connected in parallel with the load circuit, for detecting faults in the load circuit can be realised without an independent energy supply of the device according to the invention. Due to the large voltage and current range in some applications, a short circuit detection when load circuit switches are open, if at all possible, is in any case more difficult than when load circuit switches are closed. If the output is switched on, i.e. the load circuit switch is closed, the status of the lines can be detected via a measurement of the load current. If this falls below a minimum value, a line break can be assumed. If it exceeds a maximum a short circuit is to be assumed.

A measurement of this current can become difficult due to the large range over which it can vary. Typical current upper thresholds for the device according to the invention are for example 5 A. Typical lowest current strengths, for which fault-free functioning can be guaranteed, are around 2 mA. The current measurement must be realised within the housing of the relay, in which other components already produce a power dissipation. It is therefore to be ensured in the current measurement that not too much energy is converted into heat.

If a simple shunt resistor is used for the measurement this results, with a desired voltage of 100 mV and a current of 5 A, in a resistance value of 20 ma. The power dissipation is then 0.5 W. In the case of a current of 2 mA, however, there is only 40 µV, which is difficult to detect in the interface according to the invention. For this reason it is advantageous to use two different diagnostic circuits to measure the currents, one for falling short of the minimum current and another for exceeding the maximum current.

Due to the independent energy supply of the device according to the invention and/or the interface according to the invention, a relay is preferably used for fault simulation in the input circuit. As this completely disconnects the current circuit, a reliable detection as a line break is ensured. Further advantages of the relay are the automatically present galvanic isolation and the simple control with a direct voltage. In the fault-free state the input circuit is not changed, whereby no adaptation is necessary here.

In the switched-on state, thus when load circuit switches are closed, a line break is detected when the minimum current necessary for functioning is not reached. This is fixed in an application-specific way and is for example 2 mA.

If a shunt resistor is used to measure the current, this must provide a well-evaluated voltage with a current of 2 mA. The resistance value necessary for this would be so high, however, that the power dissipation generated with a current of 5 A could not be removed from the housing of the device according to the invention (or the interface according to the invention). This problem can be solved by a relatively high-ohm shunt resistor, which is bridged by a MOS-FET from a certain current.

The detection of a short circuit in the switched-on state is realised preferably similarly to the line break test, using a current measurement. It is assumed here that as soon as the current exceeds a predefined maximum value of 5 A for quite a long time, there is a short circuit. Since it is only necessary to monitor the maximum value for this, a normal shunt resistor can be used.

For the line break detection in the switched-off state, thus if the load circuit switches are open, a test current path is connected in parallel with the load circuit, which ensures a low current flow through the load. If this current does not flow, a line break is to be assumed. The first fault detection circuit generates in this case a corresponding intermediate fault signal which is possibly linked with other intermediate fault signals to form an overall fault signal and transmitted from the output part to the input part for evaluation by the controller.

Without an independent energy supply of the device according to the invention or the interface according to the invention, merely line breaks in the switched-off state could be detected.

According to a further preferred embodiment of the present invention, the overall fault signal is transmitted from the output part to the input part in a galvanically isolated way. The control of such load circuits with conventional controllers, in which loads are subjected to high currents, also becomes possible. Furthermore a suitably designed galvanic isolation prevents undesirable back-effects of interference in the load circuit on the controller.

In the present context a galvanic isolation stage is to be understood to be a means which facilitates an information transmission between two electrical circuits without an electrically conductive connection between these two electrical circuits. Important examples for such galvanic isolations or isolation stages are inductive isolation stages in the form of transformers with coils electrically isolated from each other, preferably on a common iron core, capacitive isolation stages, electromechanical components such as e.g. relays or optoelectronic converters, in particular so-called optocouplers. The galvanically isolated transmission of a fault signal, in particular from the output part to the input part, is to be understood correspondingly to be a transmission of a fault signal, in particular from the output part to the input part, without an electrically conductive connection, in particular from the output part to the input part.

This galvanic isolation is preferably carried out with the aid of a relay or an optocoupler.

Optocouplers are optoelectronic transmitters between two galvanically isolated current circuits. In comparison with other galvanic isolations they have rather small dimensions, facilitate both a digital and also an analogue transmission of a fault signal and do not have any inductances which would be considered as a source of straying electromagnetic fields. They are also insensitive with respect to interference-causing external electromagnetic fields and have shorter delay times and a lower rate of wear than electromechanical solutions. In comparison with inductive solutions for galvanically isolated transmission such as relays or transformers the input and/or output circuit of such optoelectronic transmitters is, however, frequently more sensitive with respect to an overload or interference-causing impulses.

According to a further preferred embodiment of the present invention the input circuit has a coil which is in active connection with at least one load switch.

This preferred embodiment causes a galvanically isolated transmission of the switching commands of the controller from the input part to the output part and thus the secure control also of strong current loads through controllers on the basis of conventional digital circuits without the use of power semiconductors.

Furthermore a method is provided according to the invention for monitoring and switching a load circuit with a load, wherein
  a device with an input part and an output part is or has been switched between a controller and the load circuit,
  the input part has an input circuit which converts switching commands of the controller, incoming via switching inputs, into switching processes of the load switches,
  at least a first fault detection circuit, connected in parallel with the load circuit, and at least a second fault detection circuit, connected in series with the load circuit, detect faults in the load circuit and generate at least one respective intermediate fault signal in the output part,
  a logic circuit comprising the intermediate fault signals generates an overall fault signal derived from these intermediate fault signals and transmits it from the output part to the input part, and wherein
  the overall fault signal is made available via the switching inputs for evaluation.

According to a preferred embodiment of the method according to the invention a device according to the invention has been or is switched between the controller and the load circuit, in particular according to one of the preferred embodiments described.

BRIEF DESCRIPTION OF THE DRAWINGS

Further advantageous embodiments of the invention are explained below with reference to the attached schematic drawings, in which:

FIG. 1 shows a schematic illustration of an arrangement according to the invention of a device according to the invention for monitoring and switching a load circuit between a controller and a load circuit;

FIG. 2 shows schematic illustrations of an arrangement of an interface according to the state of the art between a controller and load circuits;

FIG. 3 shows a schematic illustration of an embodiment of a device according to the invention for monitoring and switching a load circuit;

FIG. 4 shows a schematic illustration of a further embodiment of a device according to the invention for monitoring and switching a load circuit;

DETAILED DESCRIPTION OF THE INVENTION

Figure 5:
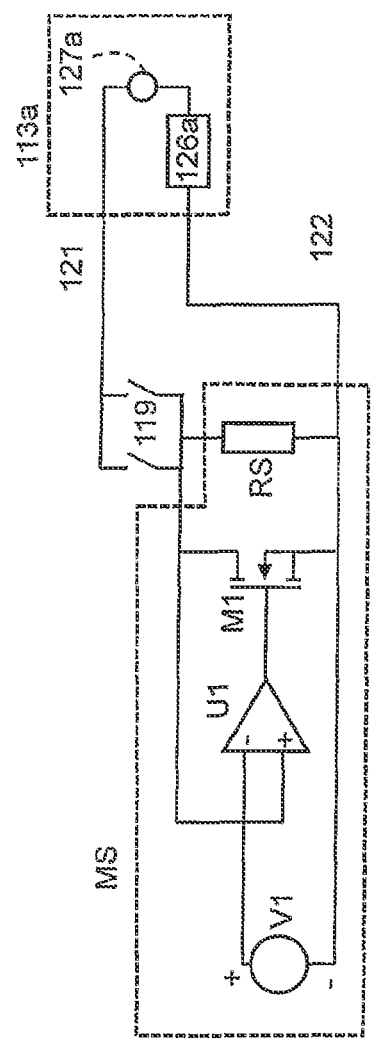
FIG. 5 shows a schematic illustration of an embodiment of a sub-circuit of a device according to the invention.

A typical, general structure, forming the basis of the present invention, of an arrangement comprising a controller 101, an interface 102 and a load circuit 103 is shown in FIG. 1.

The load circuit is the current circuit of a unit 103, such as for example an actuator or a sensor, connected to the interface 102 on the field side of the interface 102 according to the invention. In the interface 102 there is an input part 130 and an output part 131. The controller 101 transmits control signals 132 to the interface according to the invention which are received by the input part 130 and converted into control signals 133 of the input part and transmitted to the output part 131. The output part 131 controls 134 in turn the load circuit 103. Faults in the load circuit affect 137 the fault detection in the interface and are transmitted 135 by circuits for fault detection of the output part to the input part. The interface according to the invention brings about in this way a fault simulation 136 of a fault in the load circuit for the controller 101.

The present invention facilitates a line fault transparency in the sense that a fault, for example a line break or a short circuit, in the wiring on the field side of an interface according to the invention is transmitted to the control side thereof so that the controller can detect the fault, wherein the fault manifests itself on the control side in a similar or the same way for the controller as if this fault arising on the field side were present on the control side of the interface according to the invention.

FIG. 2 shows an arrangement according to the state of the art, having an interface 112 according to the state of the art, of which the input part 130 has a relay 117, with which the switches 118 and 119 can be switched in the output part 131. The current through the relay 117 comes from a current source 115 of the controller 111 which is switched using a switch 114 of the controller. The input part 130 of the interface 112 can furthermore have test inputs 116.

In the arrangement from the state of the art shown in FIG. 2 the switches 118 are connected in series, whereby a reliable switching-off of the load circuit 113b becomes possible. The load circuit 113b consists of the load 126b and the load circuit supply 127b and is connected via the contacts 123b and 125b to the output terminals 123 and 125 of the output circuit 131, whereby in the example shown here a fuse 120 is also provided. The switches 119 are connected in parallel, whereby a secure switching-on of the load circuit 113a, which consists of a load 126a and a load supply 127a and is connected via the connections 121a and 122a to the connection terminals 121 and 122 of the output circuit 131, is facilitated. The load circuit 113c consisting of the load 126c and the load circuit supply 127c is connected via the connections 121c, 122c, 123c and 125c to the connection terminals 121, 122, 123 and 125 of the interface 112 and can be switched on and off in an all-pole manner. There is, however, no redundancy of the switching contacts.

FIG. 3 shows a further embodiment of the invention, wherein the interface 202b according to the invention has two fault detection circuits 211 and 212, wherein the fault detection circuit 211 is connected in parallel with the load circuit 113a, and wherein the fault detection circuit 212 is integrated in series into the load circuit 113a. A current thus only flows through the fault detection circuit 212 if at least one of the switches 119 is closed, whereas there is only a voltage at the fault detection circuit 211 if both switches 119 are open. The logic circuit 213 links the results of the fault detections 211 and 212 and the logic result switches the no-load current switching stage 214 which is arranged in parallel with the input circuit 215 which actuates the switches 119.

The fault signals are—with or without galvanic isolation—transmitted via a logic circuit, preferably an OR-gate, from the output side to the input side. A trigger circuit and a transmitter with downstream rectifier are not absolutely necessary for this. The control of the switchable no-load current path 214 can also be realised galvanically isolated via a relay.

FIG. 4 shows a concrete illustration of the embodiment shown in FIG. 3, wherein the fault detection circuit 211 has a test current branch 311a and a circuit for line break detection 311b and wherein the fault detection circuit 212 has a circuit for line break detection 312a and a circuit for short circuit detection 312. The output signals of the fault detection circuits 311b, 312a and 312b are logically linked in the logic circuit 313, for example an OR-gate, and the result of this logic controls a relay 309 which switches the no-load current branch 314. The relay opens a series contact in the input circuit, which can be detected by the controller. The input circuit 315 actuates the switches 119.

FIG. 5 shows a preferred circuit MS for bridging the measurement shunt resistor RS, through which the load circuit current flows when the load circuit switches 119 are closed, and on which a voltage proportional to this load circuit current and the measurement shunt resistor RS falls. From a certain current strength of the load circuit current the measurement shunt resistor is bridged by the MOS-FET M1 if the operation amplifier U1, which compares the voltage falling at RS with the reference voltage V1, connects the MOS-FET M1. Power dissipation that is too great and may possibly arise at RS without this circuit is hereby avoided. This circuit consisting of V1, U1 and M1 can be constructed, as required, also in dual form in anti-parallel manner in order to facilitate use with alternating current or direct current of unknown polarity.

LIST OF REFERENCE NUMERALS

101 Controller
102 Interface according to the invention, device for monitoring and switching a load circuit
103 Load circuit, field-side unit, actuator, sensor
111 Controller
112 Interface according to the state of the art
113a Load circuit
113b Load circuit
113c Load circuit
114 Switch
115 Current source
116 Test inputs
117 Relay
118 Series switches
119 Parallel switches
120 Fuse
121 Output terminal of the interface
122 Output terminal of the interface
123 Output terminal of the interface
124 Output terminal of the interface
125 Output terminal of the interface
121a Input terminal of a load circuit
121c Input terminal of a load circuit
122a Input terminal of a load circuit
122c Input terminal of a load circuit
123b Input terminal of a load circuit
123c Input terminal of a load circuit
125b Input terminal of a load circuit
125c Input terminal of a load circuit
126a Load
126b Load
126c Load
127a Current supply in a load circuit
127b Current supply in a load circuit
127c Current supply in a load circuit
130 Input part
131 Output part
132 Control signals to interface
133 Control of the output part by the input part
134 Control of the load circuit by the output part
135 Fault message of the output part to the input part
136 Fault simulation of the interface for the controller
137 Effect of a load circuit fault on the fault detection
202a Interface according to the invention
202b Interface according to the invention
203 Current regulator
204 Trigger circuit
205 Transmitter, transformer, galvanic isolation stage
205a Primary side input of the galvanic isolation stage
205b Secondary side output of the galvanic isolation stage
209 Input terminal of the interface
210 Input terminal of the interface
211 First fault detection circuit
212 Second fault detection circuit
213 Logic circuit
214 No-load current switching stage
215 Input circuit
302a Interface according to the invention
302b Interface according to the invention
307 No-load current branch
308 MOSFET
309 Relay
311a Test current branch
311b Line break detection
312a Line break detection
312b Short circuit detection
313 Logic circuit, OR-gate
314 Relay in no-load current switching stage
315 Input circuit
RS Measurement shunt resistor
M1 MOS-FET
U1 Operation amplifier
V1 Reference voltage
MS Circuit for bridging the measurement shunt resistor

What is claimed is:

1. A device for monitoring and switching a load circuit, having:
   a) an input part and an output part,
   b) switching inputs to connect a controller to the input part,
   c) switching outputs to connect at least one load circuit with at least one load to be switched to the output part, d) at least one load switch for switching the at least one load,
e) wherein the input part has an input circuit which converts switching commands of the controller incoming via the switching inputs into switching processes of the load switches,
f) having a first fault detection circuit, connected in parallel with the load circuit, to detect faults in the load circuit and
g) having a second fault detection circuit, connected in series with the load circuit, to detect faults in the load circuit,
h) wherein the first and the second fault detection circuit each generate intermediate fault signals which are logically linked in a logic circuit to form an overall fault signal, and wherein the overall fault signal is transmitted from the output part to the input part and made available via the switching inputs for evaluation.

2. The device according to claim 1,
characterised in that
the overall fault signal is transmitted to a switching stage in the input part of the device, wherein this switching stage assumes one of at least two possible states in dependence upon whether a fault or which fault type has been detected in the load circuit.

3. The device according to claim 2,
characterised in that
the switching stage switches a no-load current in a no-load current path in the input part.

4. The device according to claim 1,
characterised in that
the logic circuit brings about an OR-operation of the intermediate fault signals.

5. The device according to claim 1,
characterised in that
the first fault detection circuit has a current regulator to take a test current from the load circuit, wherein the first intermediate fault signal generated by the first fault detection circuit is different depending upon whether the test current flows or is interrupted.

6. The device according to claim 5,
characterised in that
the first fault detection circuit has a rectifier to rectify the test current.

7. The device according to claim 5,
characterised in that
the test current is negligibly small in relation to a current flowing in the load circuit in the case of a load and is preferably constant.

8. The device according to claim 5,
characterised in that
the no-load current has essentially the same strength as the test current.

9. Device according to claim 5,
characterised in that
the test current is negligibly small in relation to a current flowing in the load circuit in the case of a load and is constant.

10. The device according to claim 1,
characterised in that
the first fault detection circuit has a circuit for detecting a line break fault in the load circuit.

11. The device according to claim 1,
characterised in that
the second fault detection circuit has a circuit for detecting a line break fault in the load circuit.

12. The device according to claim 1,
characterised in that the second fault detection circuit has a circuit to detect a short circuit fault in the load circuit.

13. The device according to claim 1,
characterised in that
the overall fault signal is transmitted from the output part to the input part in a galvanically isolated way.

14. The device according to claim 1,
characterised in that
the input circuit has a coil which is in active connection with at least one load switch.

15. The device according to claim 1,
characterised in that
the at least one load switch serves for switching on and off the at least one load.

16. A method for monitoring and switching a load circuit with a load, wherein
  a) a device with an input part and an output part is or has been switched between a controller and the load circuit,
  b) the input part has an input circuit which converts switching commands of the controller incoming via switching inputs into switching processes of the load switches,
  c) at least a first fault detection circuit, connected in parallel with the load circuit, and at least a second fault detection circuit, connected in series with the load circuit, detects faults in the load circuit and generates at least one respective intermediate fault signal in the output part,
  d) a logic circuit comprising the intermediate fault signals generates an overall fault signal derived from these intermediate fault signals and transmits it from the output part to the input part, and wherein
  e) the overall fault signal is made available via the switching inputs for evaluation.

17. The method according to claim 16, wherein the device includes:
  a) the input part and the output part,
  b) the switching inputs to connect the controller to the input part,
  c) switching outputs to connect at least one load circuit with at least one load to be switched to the output part,
  d) at least one load switch for switching the at least one load,
  e) the input part having the input circuit which converts switching commands of the controller incoming via the switching inputs into switching processes of the load switches,
  f) the first fault detection circuit, connected in parallel with the load circuit, to detect faults in the load circuit and
  g) the second fault detection circuit, connected in series with the load circuit, to detect faults in the load circuit,
  h) wherein the first and the second fault detection circuit each generate intermediate fault signals which are logically linked in a logic circuit to form an overall fault signal, and wherein the overall fault signal is transmitted from the output part to the input part and made available via the switching inputs for evaluation.

* * * * *